US010149396B2

(12) United States Patent
Lor et al.

(10) Patent No.: US 10,149,396 B2
(45) Date of Patent: Dec. 4, 2018

(54) CIRCUIT ASSEMBLY FOR AN ELECTRONIC DEVICE

(71) Applicant: Apple Inc., Cupertino, CA (US)

(72) Inventors: Jason Lor, San Francisco, CA (US); Scott L. Gooch, San Carlos, CA (US); Siddharth Nangia, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/267,067

(22) Filed: Sep. 15, 2016

(65) Prior Publication Data

US 2017/0094796 A1    Mar. 30, 2017

Related U.S. Application Data

(60) Provisional application No. 62/235,355, filed on Sep. 30, 2015.

(51) Int. Cl.
*H05K 3/28* (2006.01)
*H05K 1/18* (2006.01)

(52) U.S. Cl.
CPC ... *H05K 3/284* (2013.01); *H05K 2201/10189* (2013.01); *H05K 2203/1316* (2013.01); *H05K 2203/1327* (2013.01)

(58) Field of Classification Search
CPC .................. H05K 1/185; H05K 3/284; H05K 2201/10189; H05K 2203/1316–2203/1327
See application file for complete search history.

(56) References Cited

U.S. PATENT DOCUMENTS

| 3,950,627 A | 4/1976 | Murata et al. |
| 5,041,330 A | 8/1991 | Heerton et al. |
| 5,179,505 A | 1/1993 | Matsuo |
| 5,258,592 A | 11/1993 | Nishikawa et al. |
| 5,373,487 A | 12/1994 | Crawford et al. |
| 6,166,662 A | 12/2000 | Chuang |

(Continued)

FOREIGN PATENT DOCUMENTS

| CN | 102565149 | 7/2012 |
| CN | 104517772 | 4/2015 |

(Continued)

OTHER PUBLICATIONS

Author Unknown, "What to Do when Gadgets Get Wet," http://gadgetshow.channel15.com/gadget-show/blog/what-to-do-when-gadgets-get-wet, 2 pages, Aug. 23, 2010.

*Primary Examiner* — Hoa C Nguyen
(74) *Attorney, Agent, or Firm* — Kilpatrick Townsend and Stockton, LLP

(57) ABSTRACT

Embodiments relate to systems and methods for forming a circuit assembly for an electronic device. The circuit assembly may include a substrate and a group of surface-mounted electronic components disposed on a surface of the substrate. An electrical connector may be disposed on the surface and may be configured to receive an electrical connection from a separate electrical component or assembly. A molded layer may be formed over at least a portion of the surface fully encapsulating the group of surface-mounted electronic components and partially encapsulating the electrical connector.

16 Claims, 10 Drawing Sheets

(56) References Cited

U.S. PATENT DOCUMENTS

| | | |
|---|---|---|
| 6,292,358 B1 | 9/2001 | Lee et al. |
| 6,389,143 B1 | 5/2002 | Leedom et al. |
| 6,501,036 B2 | 12/2002 | Rochon et al. |
| 6,855,173 B2 | 2/2005 | Ehrnsperger et al. |
| 6,963,039 B1 | 11/2005 | Weng et al. |
| 7,075,781 B2 | 7/2006 | Peng |
| 7,087,850 B1 | 8/2006 | Murzanski |
| 7,230,196 B2 | 6/2007 | Toyama |
| 7,355,137 B2 | 4/2008 | Kawasaki et al. |
| 7,361,859 B2 | 4/2008 | Yoshioka et al. |
| 7,365,281 B2 | 4/2008 | Yamaguchi et al. |
| 7,580,533 B2 | 8/2009 | Schwartz |
| 7,748,272 B2 | 7/2010 | Kranz et al. |
| 7,764,936 B2 | 7/2010 | Nakasano et al. |
| 7,850,378 B1 | 12/2010 | Ligtenberg et al. |
| 7,865,210 B2 | 1/2011 | Wang et al. |
| 8,059,490 B2 | 11/2011 | Rapps et al. |
| 8,092,691 B2 | 1/2012 | Youngs et al. |
| D653,640 S | 2/2012 | Kwon et al. |
| 8,178,808 B2 | 5/2012 | Strittmatter et al. |
| 8,231,795 B2 | 7/2012 | Martin et al. |
| 8,263,886 B2 | 9/2012 | Lin et al. |
| 8,367,928 B2 | 2/2013 | Hsu et al. |
| 8,371,866 B1 | 2/2013 | Su et al. |
| 8,381,575 B2 | 2/2013 | Seo |
| 8,416,542 B2 | 4/2013 | Nakamura |
| 8,446,713 B2 | 5/2013 | Lai |
| 8,462,514 B2 | 6/2013 | Myers et al. |
| 8,470,252 B2 | 6/2013 | Odueyungbo |
| 8,500,348 B2 | 8/2013 | Dumont et al. |
| 8,482,305 B2 | 9/2013 | Johnson |
| 8,526,175 B2 | 9/2013 | Yukawa et al. |
| 8,562,095 B2 | 10/2013 | Alleyne et al. |
| 8,591,240 B2 | 11/2013 | Jenks |
| 8,614,897 B2 | 12/2013 | Tang |
| 8,624,144 B2 | 1/2014 | Chiang |
| 8,644,011 B2 | 2/2014 | Parkinson |
| 8,683,861 B2 | 4/2014 | Humbert et al. |
| 8,767,381 B2 | 7/2014 | Shukla et al. |
| 8,770,996 B2 | 7/2014 | Hsu |
| 8,800,764 B2 | 8/2014 | Wu |
| 8,804,993 B2 | 8/2014 | Shukla et al. |
| 8,826,558 B2 | 9/2014 | Priebe et al. |
| 8,844,158 B2 | 9/2014 | Dehn |
| 8,942,401 B2 | 1/2015 | Murayama |
| 8,960,818 B2 | 2/2015 | Myers et al. |
| 8,994,827 B2 | 3/2015 | Mistry et al. |
| 9,013,888 B2 | 4/2015 | Trzaskos et al. |
| 9,072,991 B2 | 7/2015 | Winters et al. |
| 9,080,961 B2 | 7/2015 | Adachi |
| 9,084,053 B2 | 7/2015 | Parkins |
| 9,084,357 B2 | 7/2015 | Shedletsky et al. |
| 9,099,264 B2 | 8/2015 | Shedletsky et al. |
| 9,105,420 B2 | 8/2015 | Shah et al. |
| 9,129,757 B2 | 9/2015 | Kanbayashi et al. |
| 9,161,434 B2 | 10/2015 | Merz et al. |
| 9,164,539 B2 | 10/2015 | Wu |
| 9,171,535 B2 | 10/2015 | Abe et al. |
| 9,226,076 B2 | 12/2015 | Lippert et al. |
| 9,240,292 B1 | 1/2016 | Lapetina |
| 9,253,297 B2 | 2/2016 | Abe et al. |
| 9,335,355 B2 | 5/2016 | Menzel et al. |
| 9,363,589 B2 | 6/2016 | Lippert et al. |
| 9,367,104 B2 | 6/2016 | Liu |
| 9,387,647 B2 | 7/2016 | Wei et al. |
| 2006/0210062 A1 | 9/2006 | DeMichele et al. |
| 2007/0003081 A1 | 1/2007 | Ram et al. |
| 2008/0302641 A1 | 12/2008 | Su |
| 2009/0002941 A1 | 1/2009 | Mongia et al. |
| 2009/0281251 A1 | 11/2009 | Bae et al. |
| 2010/0133684 A1* | 6/2010 | Oka .................... H01L 21/565 257/712 |
| 2010/0232861 A1 | 9/2010 | Shibata et al. |
| 2011/0103621 A1 | 5/2011 | Lutz |
| 2012/0067711 A1 | 3/2012 | Yang |
| 2013/0037396 A1 | 2/2013 | Yu |
| 2013/0043115 A1 | 2/2013 | Yang et al. |
| 2013/0146491 A1 | 6/2013 | Ghali et al. |
| 2013/0170685 A1 | 7/2013 | Oh et al. |
| 2013/0242481 A1 | 9/2013 | Kim et al. |
| 2014/0029206 A1 | 1/2014 | Wittenberg et al. |
| 2015/0003213 A1 | 1/2015 | Suwald |
| 2015/0092345 A1 | 4/2015 | Ely |
| 2016/0052017 A1 | 2/2016 | Weber et al. |
| 2016/0239047 A1 | 8/2016 | Weber |
| 2016/0241945 A1 | 8/2016 | Zadesky et al. |
| 2016/0379767 A1 | 12/2016 | Ely |
| 2017/0025785 A1 | 1/2017 | Song et al. |
| 2018/0068808 A1 | 3/2018 | Wang et al. |

FOREIGN PATENT DOCUMENTS

| | | |
|---|---|---|
| CN | 105049966 | 11/2015 |
| CN | 204906680 | 12/2015 |
| CN | 105323674 | 2/2016 |
| EP | 0799747 | 10/1997 |
| EP | 2326106 | 5/2011 |
| EP | 2640042 | 9/2013 |
| JP | S5620399 | 2/1981 |
| JP | 200353872 | 2/2003 |
| JP | 200483811 | 3/2004 |
| JP | 2004235724 | 8/2004 |
| JP | 2004244607 | 9/2004 |
| JP | 2011187298 | 9/2011 |
| JP | 2012253426 | 12/2012 |
| WO | WO2012/117476 | 9/2012 |
| WO | WO2015/167848 | 11/2015 |

* cited by examiner (SECTION A-A)

CIRCUIT ASSEMBLY FOR AN ELECTRONIC DEVICE

CROSS-REFERENCE TO RELATED APPLICATION

This application is a nonprovisional patent application of U.S. Patent Application No. 62/235,355, filed Sep. 30, 2015 and titled "Circuit Assembly for an Electronic Device," the disclosure of which is hereby incorporated herein by reference in its entirety.

FIELD

The described embodiments relate generally to electronic devices. More particularly, the present embodiments relate to a circuit assembly having a molded layer that embeds or encapsulates various components.

BACKGROUND

There is an increasing demand for electronic devices that are both compact and durable. However, in many cases, the minimum size of the device may be determined, at least in part, by the layout and packaging constraints of traditional electronic circuit assembly techniques. Using some traditional circuit board construction techniques, further reduction in the size of the electronic assemblies or systems may result in a reduction in the functionality and/or the reliability of the device. Thus, there is a need for systems and techniques that reduce the size of electronic assemblies without limiting functionality or reducing the durability of the assembly.

SUMMARY

Some example embodiments are directed to a circuit assembly for an electronic device. The circuit assembly may include a substrate and a group of electronic components disposed on a surface of the substrate. An electrical connector may be disposed on the surface and configured to receive an separate electrical part, such as a conduit or mating electrical component. A molded layer may be formed over at least a portion of the surface, fully encapsulating the group of electronic components, and partially encapsulating the electrical connector. The molded layer may be formed from a thermoset polymer. and the substrate may comprise a silicon sheet.

In some embodiments, the electrical connector is configured to receive the electrical connection at an end portion. The end portion may be at least partially exposed from the molded layer. In some embodiments, the end portion of the electrical connector includes a substantially flat end surface. The end surface may be approximately flush with an exterior surface of the molded layer. In some embodiments, the electrical connector is surrounded by the molded layer on four sides.

In some embodiments, the electrical connector includes an opening for receiving an electrical connection from a separate component. The opening may be substantially parallel to the surface of the substrate. In some embodiments, the opening is not parallel to the surface of the substrate. For example, the opening may be substantially perpendicular to the surface of the substrate.

In some embodiments, the circuit assembly is a main logic board of an electronic device. The group of surface-mounted components may include a computer processor. The electrical connector may include one or more of: a zero insertion force (ZIF) connector that is configured to receive a flexible conduit; or a board-to-board electrical connector for receiving an electrical connection from a separate circuit assembly.

Some example embodiments are directed to a circuit assembly for an electronic device. The circuit assembly may include a substrate, a group of electronic components disposed on a surface of the substrate, and a wall structure disposed on the surface and defining an enclosed region. A molded layer may be formed over at least a portion of the surface. The molded layer may surround a perimeter of the wall structure, and the molded layer may fully encapsulate the group of electronic components. A top surface of the wall structure may be substantially flush with an exterior surface of the molded layer. In some embodiments, an electrical connector is positioned within the enclosed region of the wall structure. In some embodiments, an environmental sensor is positioned within the enclosed region of the wall structure.

Some example embodiments are directed to a method of forming a circuit assembly for an electronic device. A group of components may be attached to a surface of a substrate. An electrical connector may be attached to the surface of the substrate. A molded layer may be formed over at least a portion of the surface to fully encapsulate the group of components and partially encapsulate the electrical connector. In some embodiments, the group of components are attached using a solder connection.

In some embodiments, the molded layer is formed by: placing a mold in contact with the surface of the substrate to define a mold cavity; and filling the mold cavity with a molding material to form the molded layer.

In some embodiments, the mold includes a protrusion that is configured to be inserted into an opening of the electrical connector. The protrusion and a surrounding region of the mold may form a seal against an end portion of the electrical connector. In some embodiments, a compliant film is disposed over at least a portion of the mold that defines the mold cavity. The compliant film may form a seal against an end portion of the electrical connector. In some embodiments, a removable plug is inserted into an opening of the electrical connector. The removable plug may prevent molding material from entering the opening while forming the molded layer.

In some embodiments, the electrical connector includes an opening for receiving an electrical connection from a separate component. The opening may be substantially parallel to the first side of the substrate. In some embodiments, the opening is not parallel or is at an angle with respect to the surface of the substrate. For example, the opening may be substantially perpendicular to the first side of the substrate.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
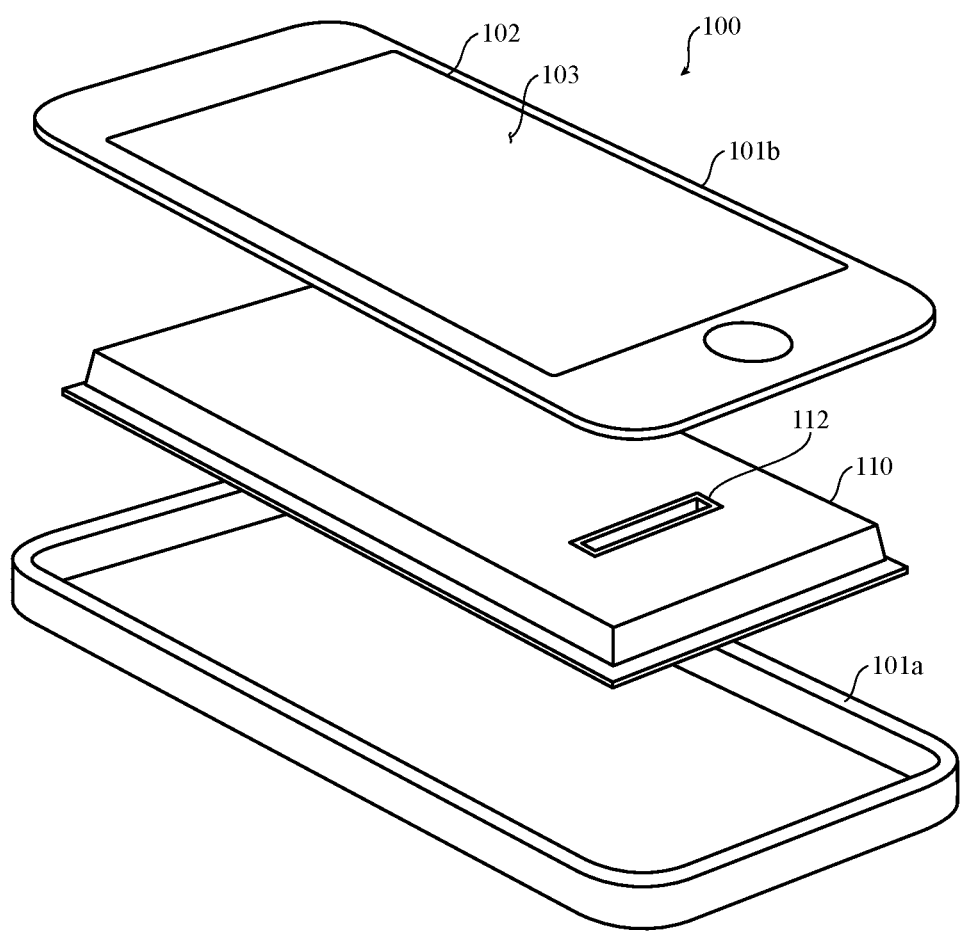
FIG. 1 depicts an exploded view of an example electronic device having a circuit assembly.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Electronic devices typically include one or more circuit assemblies configured to provide associated functionality. A circuit assembly may include a substrate, such as a printed circuit board, and a group of electronic components that are electrically and structurally coupled to a surface of the substrate. The circuit assembly may include one or more processing units, controllers, or other integrated circuits that are configured to control various aspects of the electronic device. The circuit assembly may also include components for performing various communication functionality including, for example, wireless transceivers, antennas, and specialized communication integrated circuits.

Using traditional circuit assembly techniques, the layout and spacing of the components may be constrained by the size of the bonding areas, which may provide both the electrical and structural connections between the various electronic components and the substrate. Additionally, some traditional circuit assemblies include exposed elements that may be vulnerable to moisture or other contaminants.

Some embodiments described herein are directed to a circuit assembly that includes a molded layer that encapsulates or embeds a group of electronic components within the molded material. The molded layer may provide structural support for the electronic components, which may reduce the minimum size of bonding or mounting areas for some of the components. In some instances, the use of a molded layer may allow for the components to be more tightly spaced, resulting in a more compact circuit assembly. The molded layer may also function as a protective barrier and protect the electronic components from exposure to moisture and other potential contaminants.

Using a molded layer may, however, present various challenges. For example, in order to include an electrical connector on the circuit assembly, it may be necessary to increase overall size of the substrate. For example, the substrate may be increased in length or width to accommodate an un-molded region along the edge of the substrate for mounting the connector. The size of the substrate may need to be further increased to allow for the placement of tooling (e.g., a mold chase) during the molding process in order to avoid potential interference between the tooling and any electrical connectors positioned along an edge of the substrate.

Some embodiments described herein are directed to systems and techniques for integrating an electrical connector within the molded layer of a circuit assembly. In particular, some embodiments are directed to processes for forming a molded layer that fully encapsulates the electronic components but only partially encapsulates the electrical connector. This may be achieved, for example, by forming multiple parting lines when forming the molded layer. A first interior parting line may be formed between the mold and the electrical connector, and a second parting line may be formed between the mold and the substrate of the circuitry assembly. In some cases, an end portion of the electrical connector remains exposed after the molding process in order to facilitate electrical connection with other components or assemblies.

These and other embodiments are discussed below with reference to FIGS. 1-6. However, those skilled in the art will readily appreciate that the detailed description given herein with respect to these Figures is for explanatory purposes only and should not be construed as limiting.

FIG. 1 depicts an example electronic device that includes a circuit assembly having a molded layer in accordance with some embodiments. In the present example, the electronic device 100 is a portable electronic device, such as a mobile phone. The embodiments described herein may also be applicable to a broad range of other electronic devices including, for example, tablet computing devices, notebook computing devices, desktop computing devices, portable media player devices, wearable electronic devices, health monitoring devices, and so on.

In the present example, the electronic device 100 includes a circuit assembly 110 that is positioned within a housing 101a, 101b. The circuit assembly 110 may be operatively coupled to various components of the electronic device 100 and may function as a main logic board or main controller for the device 100. In the present example, the circuit assembly 110 is operatively coupled to a display 102 and a touch sensor 103 positioned within or integrated with a top portion of the housing 101b. The circuit assembly 110 may also be operatively coupled to an internal power source, such as a battery. Other components including, for example, a speaker, a microphone, a button, a biosensor, a light source, and/or a camera may also be operatively coupled to the circuit assembly 110. While FIG. 1 depicts an electronic device 100 having a single circuit assembly 110, some implementations may include multiple circuit assemblies that are interconnected with each other and with the other various components of the electronic device 100.

The various components of the electronic device 100 may be coupled to the circuit assembly 110 using one or more electrical connections. As shown in FIG. 1, the circuit assembly 110 includes an electrical connector 112, which may be used to couple or connect the components of the electronic device 100 to the circuit assembly 110. While a single representative electrical connector 112 is depicted, the circuit assembly 110 may include multiple electrical connectors 112 depending on the implementation.

The electrical connector 112 may be configured to receive an electrical conduit, such as a flexible conduit or terminated wire bundle. In some implementations, the electrical connector 112 includes a zero-insertion force (ZIF) connector that is configured to receive a flexible circuit or conduit. The electrical connector 112 may also be configured to receive a board-to-board electrical connector that is attached to a separate circuit assembly or electrical component. Use of an electrical connector 112 may facilitate electrical connection using a removable or relatively serviceable electrical coupling, which may be advantageous over other more permanent electrical coupling techniques, such as soldering or reflowing techniques.

As shown in the exploded view of FIG. 1, the circuit assembly 110 is positioned within a housing formed from a top portion 101b and a bottom portion 101a that together form the exterior surface of the device 100. The top portion 101b may include a cover formed from a hard transparent material, such as glass, sapphire, or other ceramic. The cover may also be formed from a polymer, such as polycarbonate, acrylic, or other material. The top portion 101b may be joined to the bottom portion 101a to form an enclosed volume. The top portion 101b may be attached to the bottom portion 101a using an adhesive, mechanical joint, or other fastening technique. While FIG. 1 depicts the housing as a two-piece housing formed from top 101b and bottom 101a portions, in other embodiments, the housing may be formed from a single piece in which the circuit assembly 110 is inserted or installed. Likewise, the housing may be formed from more than two pieces that together define the exterior surface of the device 100.

Figure 2:
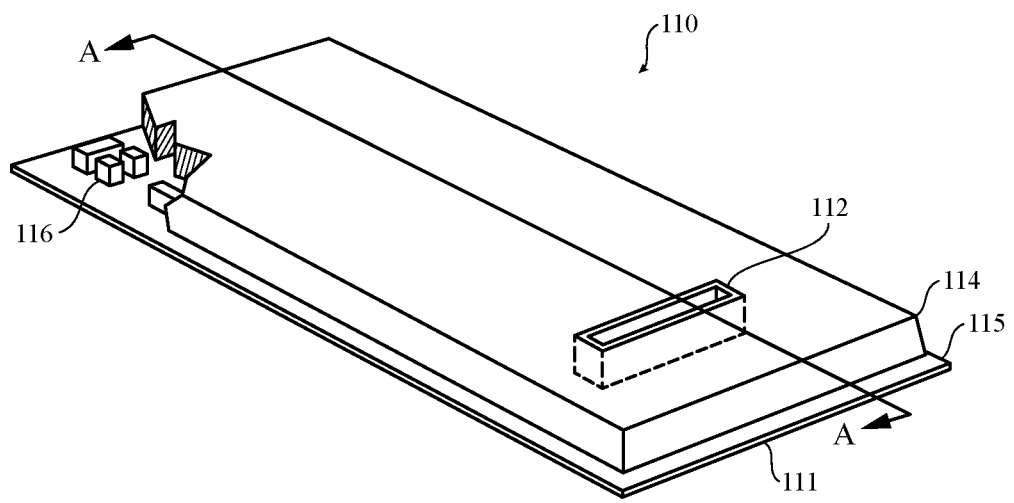
FIG. 2 depicts an example circuit assembly having a molded layer.

FIG. 2 depicts an example circuit assembly having a molded layer. The circuit assembly 110 may be used as a main logic board or other electrical system of an electronic device, as described above with respect to FIG. 1. The circuit assembly 110 may also be used as a control board for one or more hardware components, such as a display, touch sensor, biosensor module, digital camera module, or other hardware subsystem.

As shown in FIG. 2 the circuit assembly includes a substrate 111, which may be formed from substantially rigid material, such as phenolic, fiberglass, epoxy, or other similar material. In some embodiments, the substrate 111 may be formed from a semiconductor, such as silicon, germanium, or other semiconductor materials. The semiconductor may be formed as a sheet or as a substantially flat and thin portion of material. The substrate 111 may include one or more layers of electrical traces formed within the material that are configured to make electrical connections between various components of the circuit assembly 110. In some embodiments, the substrate 111 may be formed from or include a flexible or semi-rigid material, such as a polymer sheet or other flexible plastic substrate.

A group of electronic components 116 may be disposed on a surface of the substrate 111. In the present example, multiple electronic components 116 are disposed on a single (upper) side of the substrate 111. In other embodiments, both sides of the substrate 111 may be used to mount or attach electronic components. The electronic components 116 may be attached using a technique that provides both an electrical connection and a structural connection to the substrate 111. For example, the electronic components 116 may be attached to the substrate 111 using a solder connection or other electrically conductive attachment technique. In some embodiments, the electronic components 116 include one or more surface-mounted components that are configured to be attached using a surface-mount technology (SMT). For example, the electronic components 116 may include components that are configured to be mated directly to the surface of the substrate 111. The electronic components 116 may also be attached using an adhesive, mechanical fastener, or other securing technique.

The electronic components 116 may include a wide range of electronic components. For example, the electronic components 116 may include various types of passive components, including resistors, capacitors, inductors, and the like. The electronic components 116 may also include various types of integrated circuit (IC) components, radio-frequency (RF) or wireless components, discrete semiconductor components, light emitting diode components, and the like. The electronic components 116 may also include one or more computer processors, controllers, application-specific integrated circuits (ASICS), and the like. Other electronic components 116 include sensors, such as accelerometers, gyroscopes, temperature sensors, barometer sensors, magnetic field sensors, and the like. Broadly, electronic components may also include electromechanical components that may be attached to the substrate 111 or otherwise integrated with the circuit assembly 110. Example electromechanical components include thermal heat sinks, stiffeners, mechanical fasteners, shields, microelectromechanical systems (MEMS), and the like.

Figure 6:
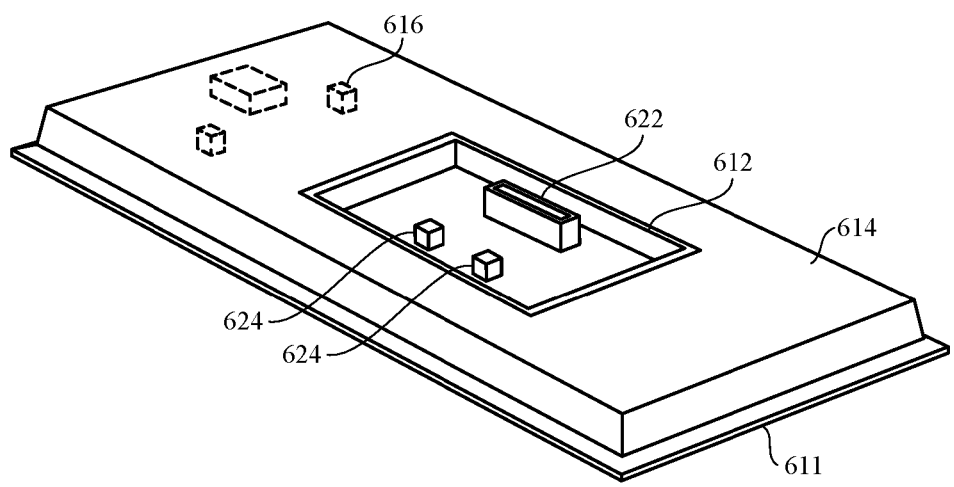
FIG. 6 depicts an example circuit assembly having an internal region formed within a molded layer.

In the present embodiment, a group of the electronic components 116 are fully encapsulated or embedded within a molded layer 114. For example, at least a subset of the electronic components 116 may be completely surrounded and fixed within the molded layer 114. It is not necessary that all of the electronic components 116 be fully encapsulated within the molded layer 114. In fact, FIG. 6 depicts an example in which at least a subset of the electronic components remains exposed after the molded layer has been formed.

The molded layer 114 may provide structural support for the electronic components 116 and help to maintain the structural (and electrical) connection between the electronic components 116 and the substrate 111. The molded layer 114 may also form a protective barrier around the electronic components 116 and prevent exposure to moisture, liquid, and other potential contaminants. The molded layer 114 may also reduce the risk of damage caused by a physical impact or other form of mechanical shock.

The molded layer 114 may substantially cover the upper surface of the substrate 111. In the present example, the molded layer 114 covers all of the upper surface except for a boundary portion 115. The boundary portion 115 may correspond to the amount of substrate that remains exposed after the molded layer 114 has been formed. The boundary portion 115 may be used to form a mold seal or parting line, as discussed in more detail with respect to FIGS. 4A-4C and 5A-5C. The boundary portion 115 may also facilitate handling of the circuit assembly 110 by providing a datum edge or feature that can be used to fixture or register the circuit assembly 110.

As shown in FIG. 2, the circuit assembly 110 also includes an electrical connector 112, which may be partially encapsulated or embedded within the molded layer 114. The electrical connector 112 may include an opening or receptacle that is configured to receive an electrical connection from a separate component or circuit assembly. In the present embodiment, an end portion of the electrical connector is at least partially exposed from the molded layer 114. In some cases, the end portion of the electrical connector 112 includes a substantially flat end surface, which may be approximately flush with the exterior surface of the molded layer 114. By keeping at least a portion of the electrical connector 112 exposed, the circuit assembly 110 may be electrically connected to other components within the device using a removable or relatively serviceable electrical coupling. The electrical connector 112 may be, for example, an existing surface-mount technology connector component that is configured to removably engage a separate connecting electrical component or conduit.

Figure 3:
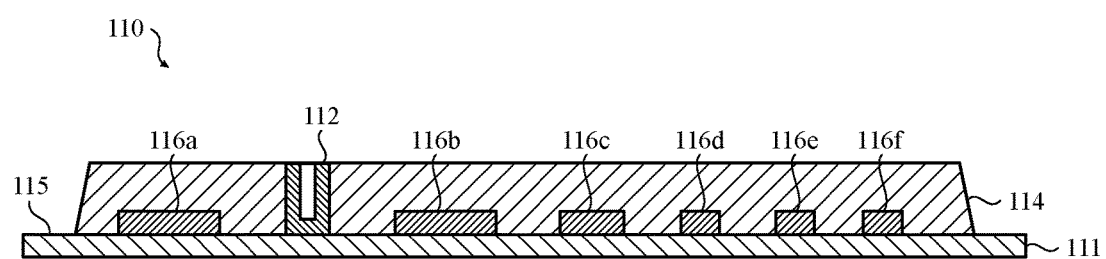
FIG. 3 depicts a cross-sectional view of the circuit assembly of FIG. 2.

FIG. 3 depicts a cross-sectional view of the circuit assembly of FIG. 2. As shown in FIG. 3, the circuit assembly 110 includes a molded layer 114 formed on an upper surface of the substrate 111. The circuit assembly 110 also includes multiple electronic components 116a-f that are fully or completely encapsulated within the molded layer 114. The electronic components 116a-f may include a variety of electrical and electromechanical components, as described above with respect to FIG. 2. A perimeter or boundary portion 115 of the substrate 111 may remain exposed after the molded layer 114 has been formed.

As shown in FIG. 3, the electrical connector 112 is only partially encapsulated by the molded layer 114. In the present embodiment, the electrical connector 112 is surrounded on four sides by the molded layer 114. An end portion of the electrical connector 112 having a flat end surface remains exposed after the molded layer 114 has been formed. As shown in FIG. 3, the flat end surface of the electrical connector 112 is substantially flush with an upper, exterior surface of the molded layer 114. In some embodiments, the electrical connector 112 may be slightly raised or protrude with respect to the exterior surface of the molded layer 114. The electrical connector 112 may also be recessed with respect to the exterior surface of the molded layer 114.

Figure 4A:
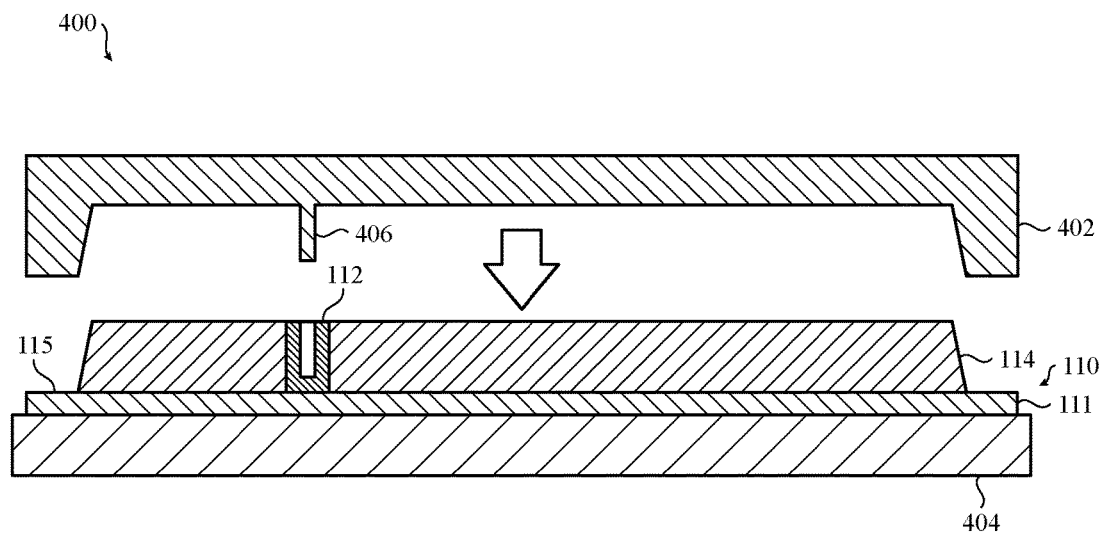
FIGS. 4A-4C depict cross-sectional views of example molding techniques for forming the circuit assembly of FIGS. 2 and 3.
Figure 4B:
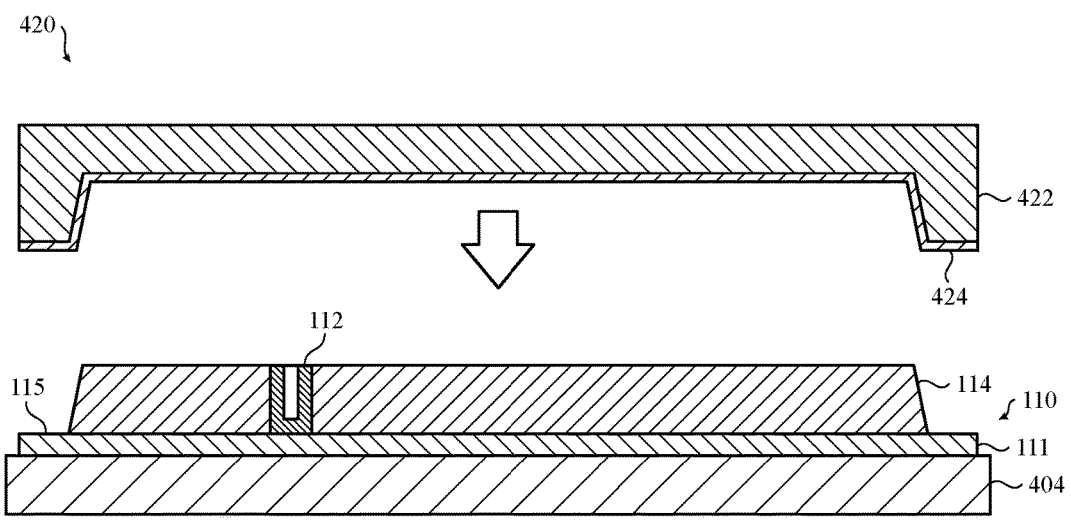
Figure 4C:
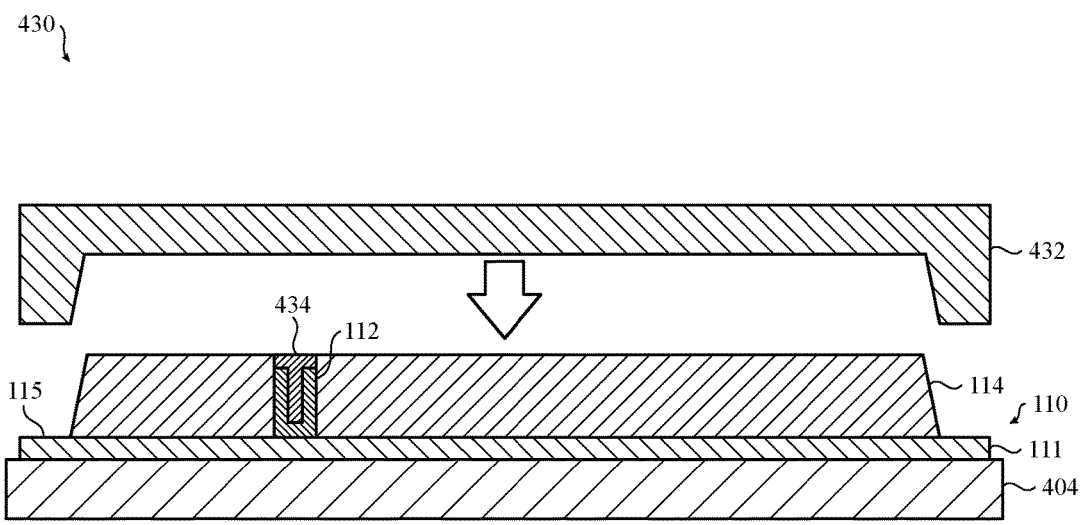

FIGS. 4A-4C depict cross-sectional views of example molding techniques for forming a circuit assembly, such as the circuit assembly 110 of FIGS. 2 and 3. In particular, FIGS. 4A-4C depict an example molding process that may be used to form the molded layer of the circuit assembly. The examples of FIGS. 4A-4C may represent a compression molding process, a transfer molding process, an injection molding process, or other similar molding process used to receive a liquid form of a material into a mold and form a solid part having a shape that corresponds to the shape of the mold.

FIG. 4A depicts an example mold 400 for forming the molded layer 114 of a circuit assembly 110 in accordance with various embodiments described herein. The example of FIG. 4A depicts the molded layer 114 after being formed into a solid part using the mold 400. In the example of FIG. 4A, the mold 400 includes a lower mold 404 and an upper mold 402, which together with the substrate 111 define a mold cavity. In the present embodiment, the upper mold 402 is configured to contact and form a seal against the boundary portion 115 of the substrate 111. In an alternative embodiment, the upper mold 402 may be configured to contact and form a seal against a portion of the lower mold 404. The seal between the upper mold 402 and the substrate 111 (or alternatively between the upper mold 402 and the lower mold 404) forms an exterior or peripheral parting line of the mold 400. The interface at the parting line may be configured to prevent leakage or flashing of the molding material during the molding operation.

The upper mold 402 also includes a protrusion 406 that is configured to be at least partially inserted into an opening or receptacle of the electrical connector 112. It is not necessary, and in some cases not desirable, that the protrusion 406 be fully inserted within the electrical connector 112. The protrusion 406 and the surrounding region of the upper mold 402 are configured to contact and form a seal against the upper or end portion of the electrical connector 112. The seal between the protrusion 406, surrounding region of the upper mold 402, and the electrical connector 112 may form an internal parting line. Similar to the external or peripheral parting line, the interface at the internal parting line may be configured to prevent leakage or flashing of the molding material during the molding operation. The insertion of the protrusion 406 into the opening of the electrical connector 112 may reduce the potential for flashing or leakage into the electrical connector 112.

In general, it may be advantageous to control the tolerance between the components that form both the external and internal parting line of the mold. In particular, the overall flatness of the boundary portion 115 of the substrate 111 should be maintained with respect to the electrical connector 112. The height of the electrical connector 112 and the thickness of any mounting medium (e.g., solder or adhesive) may be controlled to provide a consistent height difference between the top surface of the boundary portion 115 and the end surface of the electrical connector 112. In some embodiments, an assembly fixture is used to position the electrical connector 112 to a height that facilitates the formation of a reliable parting line during the molding operation. In some embodiments, the end surface of the electrical connector 112 may be machined or ground to achieve the desired height. In some implementations, a compliant material or gasket is integrally formed on the end of the electrical connector 112, which may provide enough compliance to accommodate variations in tolerance between the various components.

When the upper mold 402 and lower mold 404 are brought together, the mold cavity may be substantially enclosed and sealed (except for one or more injection ports or other liquid-delivery passages). A liquid form of the molding material may be introduced to the mold cavity using a pressure or gravity feed delivery system. The liquid form of the material may be in a melted or uncured state and have a viscosity sufficiently low to enable the liquid to fill the entire mold cavity. In some cases, pressure and/or a vacuum is used to force or draw air out of the mold cavity during the filling operation.

In some embodiments, a progressive pressure is applied to the liquid as the molded layer 114 is being formed. For example, the pressure of the liquid material in the mold may be progressively increased in accordance with a progressively increasing clamp pressure exerted between the upper and lower molds 402, 404. The application of a progressive pressure profile over a molding operation may facilitate higher clamping forces without crushing or damaging components of the circuit assembly 110, particularly the electrical connector 112.

Once the mold cavity has been filled, the liquid form of the material may be cooled and/or cured to form a solid molded layer 114. In some embodiments, one or both of the upper and lower molds 402, 404 include heating and/or cooling elements that may be controlled to facilitate a filling, curing, and/or cooling operation. Once the solid molded layer has been cured or cooled, the upper and lower molds 402, 404 may be separated and the circuit assembly 110 may be removed. As shown in FIG. 4A, one or more surfaces of the upper mold 402 may be drafted or tapered to facilitate removal of the circuit assembly 110 after the molded layer 114 has been formed.

The mold 400 may be used to form the molded layer 114 from a variety of different materials. In some embodiments, the molded layer 114 may be formed from a thermoset polymer, such as a polyurethane, polyester, polyimide, resin, or other similar material. In some embodiments, the molded layer may be formed from a thermoplastic polymer, such as a polycarbonate, polyethylene, nylon, acrylic, acrylonitrile butadiene styrene (ABS), or other similar material. In general, it may be beneficial to use a material that can be molded in a process that does not require temperatures that could damage the electronic components of the circuit assembly 110.

FIG. 4B depicts an example mold 420 for forming the molded layer 114 of a circuit assembly 110 in accordance with various embodiments described herein. In the example of FIG. 4B, the mold 420 includes a lower mold 404 and an upper mold 422, which together with the substrate 111 define a mold cavity. Similar to the previous example, the upper mold 422 is configured to contact and form a seal against the boundary portion 115 of the substrate 111. In an alternative embodiment, the upper mold 422 may be configured to contact and form a seal against a portion of the lower mold 404. The seal between the upper mold 422 and the substrate 111 (or alternatively between the upper mold 422 and the lower mold 404) form an exterior or peripheral parting line of the mold 420, which may be configured to prevent leakage or flashing of the molding material during the molding operation.

Similar to the previous example, the upper mold 422 is also configured to contact and form a seal against the upper or end portion of the electrical connector 112 to form an internal parting line. Similar to the external or peripheral parting line, the interface at the internal parting line may be configured to prevent leakage or flashing of the molding material during the molding operation.

To facilitate the formation of an internal and external parting line, a compliant film 424 may be disposed between a surface of the upper mold 422 and the mating surfaces, such as between the boundary portion 115 and the end surface of the electrical connector 112. The compliant film 424 may accommodate some amount of dimensional variation between the various components of the system to facilitate a consistent and reliable internal and external parting line. In particular, the compliant film 424 may accommodate some variation in height of the end surface of the electrical connector 112 with respect to the boundary portion 115. The compliant film 424 may also facilitate the formation of a seal by conforming to local surface irregularities along the boundary portion 115 and/or the electrical connector 112.

The compliant film 424 may be formed from a polymer film such as polyester Mylar, Polyimide Kapton, polyester PEN, and other similar materials. In some embodiments, the compliant film 424 has a thickness less than 1 mm. In some cases, the compliant film 424 has a thickness of approximately 0.1 mm. The compliant film 424 may include an adhesive or bonding layer to facilitate installation into mold 420.

FIG. 4C depicts an example mold 430 for forming the molded layer 114 of a circuit assembly 110 in accordance with various embodiments described herein. In the example of FIG. 4C, the mold 430 includes a lower mold 404 and an upper mold 432, which together with the substrate 111 define a mold cavity. Similar to the previous examples, the upper mold 432 is configured to contact and form a seal against the boundary portion 115 of the substrate 111 to form an exterior or peripheral parting line of the mold 430, which may be configured to prevent leakage or flashing of the molding material during the molding operation.

An internal parting line may be formed around the electrical connector 112 by using a removable plug 434. The removable plug 434 may be inserted into an opening of the electrical connector 112 prior to molding. The removable plug 434 may be configured to prevent the (liquid) mold material from entering the opening while forming the molded layer 114. The removable plug 434 may be formed from a compliant material to facilitate the formation of both an internal and external parting line. In particular, the removable plug 434 may accommodate variations in height between the substrate 111 of the circuit assembly 110 and the end surface of the electrical connector 112.

Additionally, the removable plug 434 may remain inserted into the electrical connector 112 after molding in order to prevent foreign contaminants from entering the electrical connector 112. In some cases, the removable plug 434 forms a moisture-proof barrier to prevent liquid, water vapor, or other moisture from entering the electrical connector 112. The removable plug 434 may remain inserted into the electrical connector 112 until the circuit assembly 110 is being installed in the electronic device.

Figure 5A:
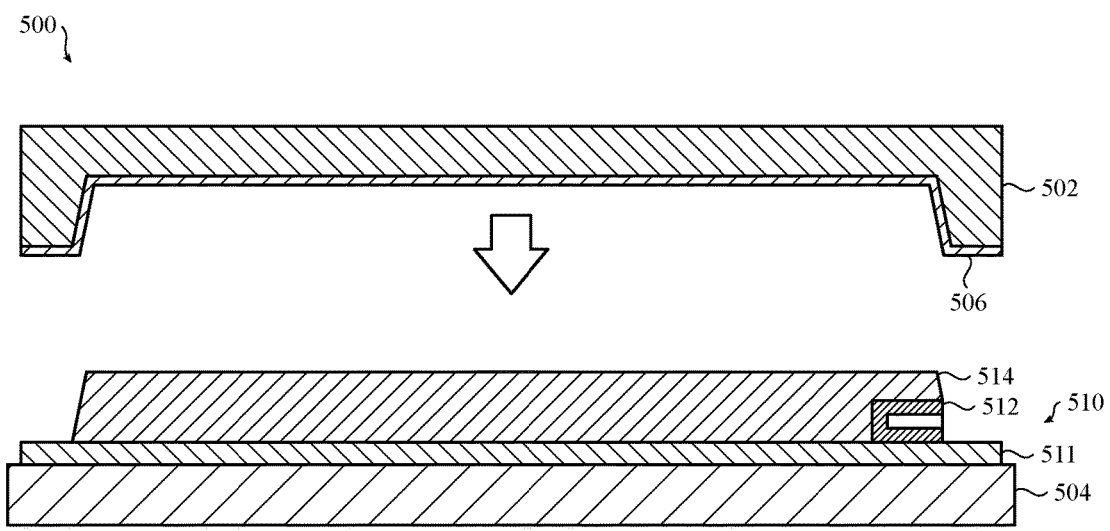
FIGS. 5A-5C depict cross-sectional views of example molding techniques for forming an alternative circuit assembly.
Figure 5B:
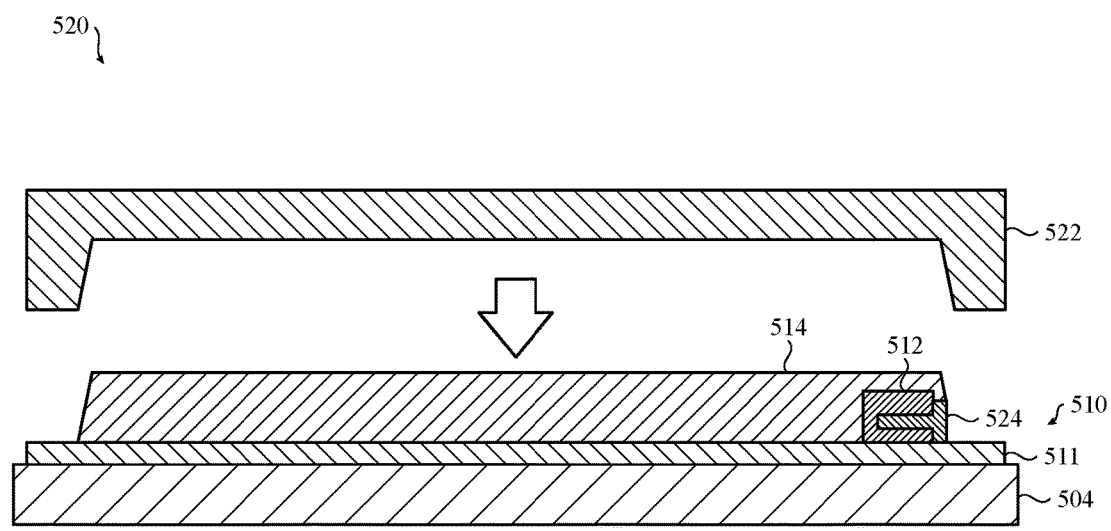
Figure 5C:
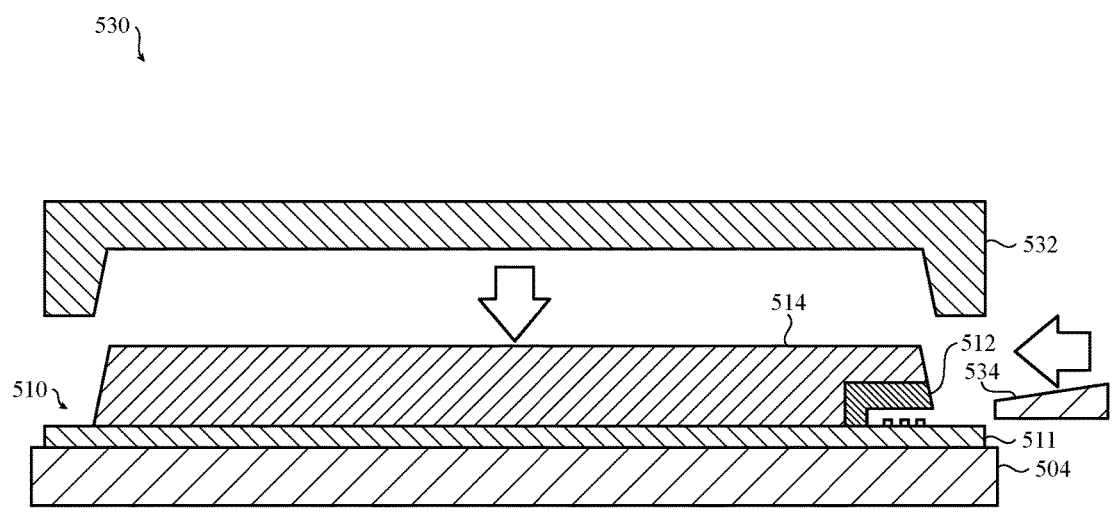

FIGS. 5A-5C depict cross-sectional views of example molding techniques for forming an alternative circuit assembly. In the examples of FIGS. 5A-5C, the electrical connector 512 is mounted along an edge of the substrate 511 in an orientation that is at an angle with respect to (e.g., substantially perpendicular to) the examples of FIGS. 4A-4C. In particular, in the examples of FIGS. 4A-4C the electrical connector 112 is positioned such that the opening for receiving the electrical connection is substantially parallel to the upper surface of the substrate 111. This configuration may be referred to as an end-mounted connector. In contrast, in the examples of FIGS. 5A-5C, an electrical connector 512 is positioned such that the opening for receiving the electrical connection is at an angle with respect to (e.g., substantially perpendicular to) the upper surface of the substrate 511. This configuration may be referred to as a side-mounted connector.

FIG. 5A depicts an example mold 500 for forming a circuit assembly 510 having a side-mounted electrical connector 512. In this example, the electrical connector 512 is positioned along an edge of the substrate 511 of the circuit assembly 510. While the electrical connector 512 is depicted as being offset or recessed with respect to an edge of the substrate 511, in other examples, the electrical connector 512 may be flush or extend beyond the edge of the substrate 511.

Similar to the previous examples, the mold 500 includes an upper mold 502 and a lower mold 504 that, along with the circuit assembly 510, are configured to define a mold cavity used to form the molded layer 514. In this example a first parting line is formed between the upper mold 502 and the substrate 511. The first parting line is formed around the perimeter or outside edges of the substrate 511 similar to the previous examples. A second parting line is formed between a side wall of the upper mold 502 and the end surface of the electrical connector 512.

To facilitate sealing and prevent leakage or flashing at both parting lines, a compliant film 506 may be used as shown in FIG. 5A. In particular, a compliant film 506 may be disposed between one or more surfaces of the upper mold 502 and the substrate 511 and the electrical connector 512. As described previously with respect to FIG. 4B, the compliant film 506 may accommodate variations in dimensions or tolerances between the components to facilitate reliable parting lines within the mold 500. The materials used for the compliant film 506 are similar to those described above with respect to FIG. 4B.

FIG. 5B depicts an example mold 520 for forming a circuit assembly 510 having a side-mounted electrical connector 512 that is positioned along an edge of the substrate 511 of the circuit assembly 510. Similar to the previous examples, the mold 520 includes an upper mold 522 and a lower mold 504 that, along with the circuit assembly 510, are configured to define a mold cavity used to form the molded layer 514.

Similar to the example of FIG. 4C, the embodiment of FIG. 5B includes a removable plug 524 that is inserted at least partially within an opening or receptacle of the electrical connector 512. In this example a first parting line is formed between the upper mold 522 and the substrate 511. A second parting line is formed between a side wall of the upper mold 522 and the removable plug 524. Similar to the previous example, the removable plug 524 may be formed from a compliant material, which may accommodate variations in dimensions or tolerances between the components to facilitate reliable parting lines within the mold 520. Also similar to the previous example, the removable plug 524 may remain installed or inserted after molding to protect internal contacts or components of the electrical connector 512.

FIG. 5C depicts an example mold 530 for forming a circuit assembly 510 having a side-mounted electrical connector 512 that is positioned along an edge of the substrate 511 of the circuit assembly 510. Similar to the previous examples, the mold 530 includes an upper mold 532 and a lower mold 504 that, along with the circuit assembly 510, are configured to define a mold cavity used to form the molded layer 514.

In the present example, a side-action insert 534 may be inserted into an opening of the electrical connector 512 to prevent molding material from entering the electrical connector 512 during the molding process. The insertion of the side-action insert 534 may be coordinated with the closing of the upper mold 532 with respect to the lower mold 504. The insertion of the side-action insert 534 may be mechanically linked to the motion of the upper and lower molds 532, 504. In some cases, the insertion of the side-action insert 534 is performed by a separate actuator or drive system.

Similar to the previous examples, a first parting line may be formed between the upper mold 532 and the substrate 511 of the circuit assembly 510. A second parting line may be formed between the upper mold 532 and the side-action insert 534 to seal the opening of the electrical connector 512. The seal or parting line between the upper mold 532 and the side-action insert 534 may be adjusted or maintained by controlling the insertion distance of the side-action insert 534. For example, the side-action insert 534 may include a taper or draft that is configured to mate with a corresponding taper or draft on the upper mold 532. Inserting the side-action insert 534 further into the mold cavity may decrease the gap or take up any clearance between the two components due to the mating tapers or drafts. Thus, the side-action insert 534 may provide an active measure for accommodating for variations in dimensions between the components.

In general, the system and techniques described above with respect to FIGS. 4A-4C and 5A-5C may be used to form a molded layer having two parting lines. By forming an internal parting line, an interior region of the molded layer may remain exposed or unmolded, which may be advantageous for providing access to an embedded electrical connector. Similar techniques may also be applied to other constructions to define an internal, un-molded region within the circuit assembly that can be used to mount various types of components.

FIG. 6 depicts an example circuit assembly 610 having an internal region formed within a molded layer. In the present example, a wall structure 612 may be used to define an enclosed region which is surrounded by the molded layer 614. Various components 624 may be positioned within the enclosed region, as depicted in FIG. 6.

In the example of FIG. 6, the wall structure 612 may be attached to or otherwise disposed on a surface of a substrate 611. A group of electronic components 616 may also be disposed on the same surface of the substrate 511. The wall structure 612 and/or the electronic components 616, 622, 624 may be attached using surface mount technology, in accordance with other examples provided herein.

Similar to the previous examples, a molded layer 614 may fully or completely encapsulate the group of electronic components 616. The molded layer 614 may also surround a perimeter of the wall structure 612 to partially encapsulate the wall structure 612. As shown in FIG. 6, the interior volume defined by the wall structure 612 may be unmolded or otherwise not encapsulated by the molded layer 614.

Any one of the molding techniques described above with respect to FIGS. 4A-4C may be used to form the unmolded, interior volume depicted in FIG. 6. In particular, an internal parting line may be formed between an upper mold and an upper surface of the wall structure 612. As shown in FIG. 6, the upper surface of the wall structure 612 is substantially flush with an upper, exterior surface of the molded layer 614. Similar to previous examples, an external parting line may also be formed between the upper mold and the upper surface of the substrate 611. To facilitate formation of two parting lines, a protrusion similar to as described with respect to FIG. 4A may be used. Similarly, the compliant film of FIG. 4B and the removable plug of FIG. 4C may also be used to form the two parting lines.

The formation of an enclosed volume may be advantageous for mounting various components. As shown in FIG. 6, an electrical connector 622 may be positioned within the enclosed volume, which may provide access to one or more sides of the electrical connector 622. This may be advantageous if the electrical connector 622 is a zero-insertion force (ZIF) connector having a clamp or release mechanism located along the side or base of the connector. In some embodiments, the wall structure 612 is offset from the electrical connector 622 with just enough space to access the clamp or release mechanism with a thin tool.

In some embodiments, other components 624, such as an environmental sensor, may be positioned within the enclosed region of the wall structure 612. Exposure to environmental conditions may be important or critical to the operation of various environmental sensors, such as barometric sensors, moisture sensors, humidity sensors, ambient temperature sensors, and the like. Other components 624 may also include field-serviceable components or adjustable components, such as adjustable potentiometers, that may require direct physical interaction during normal operation or servicing.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:
1. A mobile phone comprising:
 a circuit assembly comprising:
  a substrate;
  a group of electronic components disposed on a surface of the substrate;
  an electrical connector disposed on the surface; and
  a molded layer formed over at least a portion of the surface, fully encapsulating the group of electronic components, and partially encapsulating the electrical connector; and
 a housing component comprising:
  a display electrically coupled to the circuit assembly via the electrical connector; and a touch sensor electrically coupled to the circuit assembly via the electrical connector.

2. The mobile phone of claim 1, wherein:
the electrical connector is configured to receive the electrical connection at an end portion; and
the end portion is at least partially exposed from the molded layer.

3. The mobile phone of claim 2, wherein:
the end portion of the electrical connector includes a substantially flat end surface; and
the end surface is approximately flush with an exterior surface of the molded layer.

4. The mobile phone of claim 1, wherein the electrical connector is surrounded by the molded layer on four sides.

5. The mobile phone of claim 1, wherein the molded layer is formed from a thermoset polymer.

6. The mobile phone of claim 1, wherein:
the electrical connector includes an opening for receiving an electrical connection from a separate component; and
the opening is substantially parallel to the surface of the substrate.

7. The mobile phone of claim 1, wherein:
the electrical connector includes an opening for receiving an electrical connection from a separate component; and
the opening is substantially perpendicular to the surface of the substrate.

8. The mobile phone of claim 1, wherein the substrate comprises a silicon sheet.

9. The mobile phone of claim 1, wherein:
the circuit assembly is a main logic board of the mobile phone; and
the group of components includes a computer processor.

10. The mobile phone of claim 1, wherein the electrical connector is:

a zero insertion force (ZIF) connector that is configured to receive a flexible conduit; or
a board-to-board electrical connector for receiving an electrical connection from the display and the touch sensor.

11. The mobile phone of claim 1, wherein:
the housing component further comprises a transparent cover; and
the display and the touch sensor are coupled to the transparent cover.

12. The mobile phone of claim 1, wherein the housing component is positioned above the circuit assembly.

13. An electronic device, comprising:
a first circuit assembly comprising:
　a substrate;
　an encapsulation layer positioned on the substrate;
　an electronic component attached to the substrate and encapsulated by the encapsulation layer; and
　an electrical connector attached to the substrate and only partially encapsulated by the encapsulation layer; and
a second circuit assembly coupled to a transparent cover layer of a housing and comprising a display electrically coupled to the first circuit assembly via the electrical connector.

14. The electronic device of claim 13, wherein the electrical connector and the encapsulation layer define a continuous surface.

15. The electronic device of claim 13, wherein a first end of the electrical connector is attached to the substrate and a second end of the electrical connector opposite the first end is not encapsulated by the encapsulation layer.

16. The electronic device of claim 13, further comprising a touch sensor coupled to the substrate.

* * * * *